(12) United States Patent
Loh

(10) Patent No.: US 7,078,947 B2
(45) Date of Patent: Jul. 18, 2006

(54) PHASE-LOCKED LOOP HAVING A SPREAD SPECTRUM CLOCK GENERATOR

(75) Inventor: Kou Hung Loh, Fremont, CA (US)

(73) Assignee: Silicon Bridge Inc., Fremont, CA (US)

( * ) Notice: Subject to any disclaimer, the term of this patent is extended or adjusted under 35 U.S.C. 154(b) by 171 days.

(21) Appl. No.: 10/744,158

(22) Filed: Dec. 21, 2003

(65) Prior Publication Data

US 2005/0134335 A1 Jun. 23, 2005

(51) Int. Cl.
*H03L 7/06* (2006.01)

(52) U.S. Cl. .................................. 327/156; 327/299

(58) Field of Classification Search ............... 327/141, 327/147, 156, 291, 292, 299; 377/130, 293, 377/294, 373–375

See application file for complete search history.

(56) References Cited

U.S. PATENT DOCUMENTS

| | | | | |
|---|---|---|---|---|
| 5,940,428 A | * | 8/1999 | Ishiguro et al. | 375/150 |
| 6,404,294 B1 | * | 6/2002 | Sha et al. | 331/57 |
| 6,553,057 B1 | * | 4/2003 | Sha et al. | 375/130 |
| 6,559,698 B1 | * | 5/2003 | Miyabe | 327/157 |
| 6,665,019 B1 | * | 12/2003 | Pronkine | 348/540 |
| 6,697,416 B1 | * | 2/2004 | Jennings | 375/130 |
| 6,703,902 B1 | * | 3/2004 | Jeon et al. | 331/17 |

\* cited by examiner

*Primary Examiner*—Timothy P. Callahan
*Assistant Examiner*—Cassandra Cox
(74) *Attorney, Agent, or Firm*—TransPacific Law Group

(57) ABSTRACT

The phase-looked loop having spread spectrum clock generator of this invention comprises a phase-locked loop and a spread spectrum clock generator. The input signal of the phase-locked loop comes from a reference clock source. The output of the phase-locked loop is used as the standard clock signal and is also supplied to the spread spectrum clock generator, as its input. The spread spectrum clock generator comprises a clock frequency divider, a multiplexer and a counter. The clock frequency divider generates, based on the output of the phase-locked loop, at least tow of a divided-by-M frequency, a divided-by-M+1 frequency and a divided-by-M−1 frequency, which are supplied to the multiplexer. The phase selection of the multiplexer is supplied by the counter, which input is supplied by the output of the multiplexer. The output signal of the multiplexer is supplied to the phase-locked loop, as its feedback clock frequency. Down spreading, up spreading and even spreading of the spectrum of the output standard clock are thus achieved.

4 Claims, 3 Drawing Sheets

PHASE-LOCKED LOOP HAVING A SPREAD SPECTRUM CLOCK GENERATOR

FIELD OF THE INVENTION

The present invention relates to phase-locked loop having a spread spectrum lock generator, especially to a phase-lock loop with fixed phase step modulation.

BACKGROUND OF THE INVENTION

The clock signal generator using crystal oscillator is widely used in all kinds of digital electronic equipment, such as personal computer, network communications devices, computer peripherals and the consumer products, to generate clock signals. Clock signals generated by clock generator are used as reference of synchronization for the electronic equipment. However, the intensive operations of the digital circuitry used in the electronic equipment generate radiation that causes electromagnetic interference (EMI) emissions, too. According to the regulations of most countries, EMI generated by electronic equipment needs to be eliminated by using additional filter or shielding, before the electronic equipment may be put to the market. In these countries, EMI is regulated against the "peaking" of electromagnetic emissions, rather than their total energy. Among all kinds of EMI suppression technology, the spread spectrum clocking (SSC) technology is most popular. The SSC technology periodically modulates the frequency of the clock signals, such that the peak energy of clock signals is spread into wider and flatter peaking spectrum.

The phase-locked loop (PLL) is widely used as a standard built-in clock signal generator for modern electronic systems to provide frequency synthesis functions based upon precision clock sources such as the crystal oscillator. Embedding the spread spectrum clock generator in PLL is thus a desirable feature to save the implementation cost, in the modulation of EMI in order to comply with applicable EMI regulations.

Hardin et al. disclosed a spread spectrum clock generator and associated method in their U.S. Pat. No. 5,488,627. The invention of Hardin et al. provides the basic infrastructure of embedding a spread spectrum clock generator in the phase-locked loop. In their invention, the phase-locked loop modulates a voltage controlled oscillator (VCO), such that the output signals are compatible with the input of the phase detector. The spread spectrum clock generator frequency modulates the clock pulses with a periodic waveform having a predetermined period and a predetermined frequency deviation profile as a function of the predetermined period.

After the invention of Hardin et al., many phase-locked loops with spread spectrum clock generator were disclosed. Among them, Sha's U.S. Pat. No. 6,377,646 disclosed a spread spectrum at phase lock loop feedback path. According Sha's invention, outputs of the phase-locked loop are fed back via a feedback divider to a phase detector positioned at front end of the phase-locked loop, as input component of the phase detector. Outputs of the feedback divider are given to a spread spectrum clock generator. The spread spectrum clock generator comprises a counter, a 4 bit phase-locked spread spectrum clock generator, ROM and an adder. The output of the feedback divider provides a modulated waveform to the output of the VCO, such that the output of the VCO is spread within a predetermined bandwidth. As a result the peaking value of the clock signal is reduced. In this invention, the spread spectrum clock generator generates an adjustment factor to the feedback divider, so to determine the width and the waveform of the spread spectrum.

In the '646 patent, a programmable counter is used to give a value, taking the output of the feedback divider as basis. The output of the counter is used to select applicable codes from the ROM. The selected code is added with a base number and the result is supplied to the feedback divider to adjust a value in the feedback divider. The ROM codes are generated by a least-mean-squared (LMS) error method.

In Sha's invention, the spread spectrum clock generator comprises a counter, a ROM, a ROM decoder, an adder and a divider. The decoding involved complicated circuit or operations. The SSC generator of Sha's invention is expensive in cost and complicated in circuit or software design.

It is thus necessary to provide a low cost phase-locked loop having spread spectrum clock generator.

It is also necessary to provide a simplified phase-locked loop having spread spectrum clock generator.

OBJECTIVES OF THE INVENTION

The objective of this invention is to provide a low cost phase-locked loop having spread spectrum clock generator.

The objective of this invention is also to provide a simplified phase-locked loop having spread spectrum clock generator.

The objective of this invention is to provide a fixed phase step modulated phase-locked loop having spread spectrum clock generator.

SUMMARY OF THE INVENTION

According to this invention, a phase-locked loop having spread spectrum clock generator is disclosed. The phase-looked loop having spread spectrum clock generator of this invention comprises in general a phase-locked loop and a spread spectrum clock generator. The input signal of the phase-locked loop comes from a reference clock source. The output of the phase-locked loop is used as the standard clock signal and is also supplied to the spread spectrum clock generator, as its input. The spread spectrum clock generator comprises a clock frequency divider, a multiplexer and a counter. The clock frequency divider generates, based on the output of the phase-locked loop, at least two of a divided-by-M frequency, a divided-by-M+1 frequency and a divided-by-M−1 frequency, which are supplied to the multiplexer. The selection code of the multiplexer is supplied by the counter, which input is supplied by the output of the multiplexer. The output signal of the multiplexer is supplied to the phase-locked loop, as its feedback clock frequency. Down spreading, up spreading and even spreading of the spectrum of the output standard clock are thus achieved.

These and other objectives and advantages of this invention may be clearly understood from the detailed description by referring to the following drawings.

DETAILED DESCRIPTION OF THE INVENTION

Figure 1:
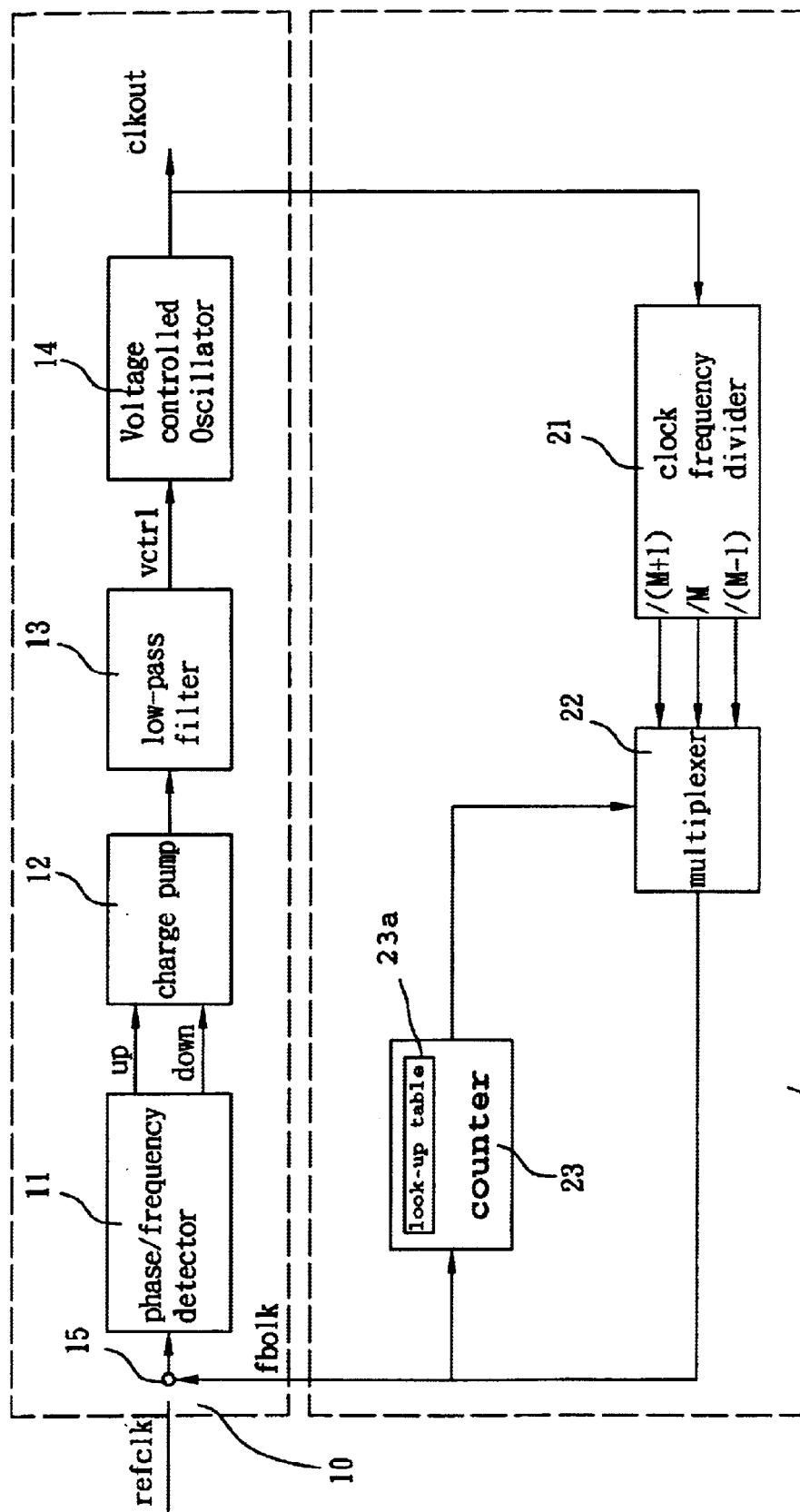
FIG. 1 illustrates the block diagram of the phase-locked loop having spread spectrum clock generator of this invention.

The present invention provides a phase-locked loop having spread spectrum clock generator which modulates the clock signals with fixed phase steps. FIG. 1 illustrates the block diagram of the phase-locked loop having spread spectrum clock generator of this invention. As shown in this figure, the phase-locked loop having spread spectrum clock generator of this invention comprises in general a phase-locked loop 10 and a spread spectrum clock generator 20.

The phase-locked loop 10 of this invention comprises a phase/frequency detector 11, a charge pump 12, a low-pass filter 13 and a voltage controlled oscillator 14. Inputs of the phase/frequency detector 11 include the reference clock signal (refclk), which is a frequency signal generated basically by a crystal oscillator, after being processed. The output of the phase/frequency detector 11 includes a PUMP UP signal and a PUMP DOWN signal, which are supplied to the two switches (up) and (down) of the charge pump 12, to control the operation of the charge pump 12. Voltage generated by the charge pump 12 is filtered by the low pass filter 13 and is supplied to the voltage controlled oscillator (VCO) 14 as its reference voltage (vctrl). Based on tile reference voltage, the VCO 14 generates a clock signal (clkout). The VCO 14 may be any circuit that generates clock frequency signals in response to an input reference voltage. In general, a ring oscillator may be a typical VCO structure. Since the structure of the phase-locked loop 10 is known to those skilled in the art, detailed description thereof is thus omitted.

The spread spectrum clock generator 20 of this invention comprises a clock frequency divider 21, a multiplexer 22 and a counter 23. The clock frequency divider 21 is a divider and is input is the output clock signal (clkout) of the phase-locked loop 10.

In the present invention, the clock frequency divider 21 uses a fixed phase step method to modulate output clock signal (clkout) of the phase-locked loop 10. In other words, the divider 21 divides the output clock signal (clkout) of the phase-locked loop 10 with dividers of M, M+1 and/or M−1, respectively. That is, output of the divider 14 includes signals with the frequency of M times, M+1 times and/or M−1 times of that of the output clock signal (clkout). This can also be done by a divided-by-M divider with selectable phases between +1, 0 and −1 time step, where each time step is equal to the period of the divider input clock. These clock signals are supplied to the multiplexer 22. The multiplexer 22 may be a 2 to 1 or 3 to 1 multiplexer and its selection signal comes from the counter 23. The counter 23 is preferably a programmable counter and its input is the frequency signal as generated by the multiplexer 22. The counter 23 picks up the frequency signals of the multiplexer 22 and generates a selection code to the multiplexer 22, when its count reaches a predetermined value, such that frequency of output signals of the multiplexer 22 is selected.

According to the embodiments of the present invention, the counter 23 directs the output frequency signal of the multiplexer 22 to a look-up-table 23a, to select from increasing, maintaining and decreasing the divider of the divider 21. The look-up-table 23a may be a phase to time reference table. Figures contained in the look-up-table 23a include time intervals as calculated from experimental data.

Figure 2:
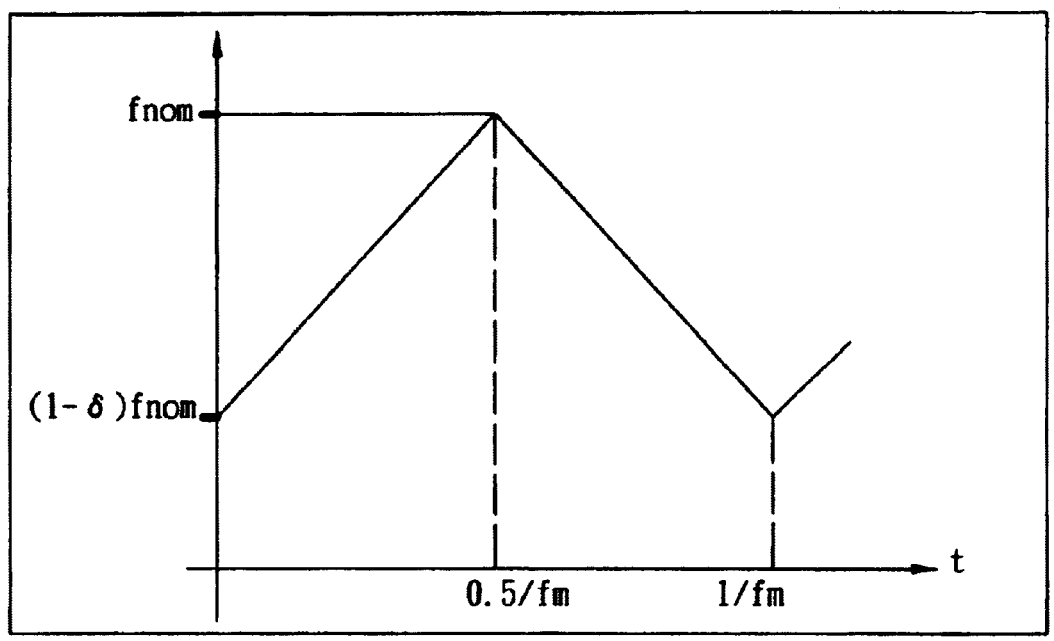
FIG. 2 illustrates the triangle shape modulation of clock frequency when down spreading the spectrum of the clock signals.

Suppose the nominal frequency of the VCO is fnom. The nominal frequency is generated by a phase-locked loop without a spread spectrum clocking and is M times the frequency of the reference clock signal refclk, i.e., fnom= frefclk×M, frefclk is the frequency of refclk. Process the VCO signal with spread spectrum clocking, including average spreading, down spreading and up spreading. Take the down spreading as example. The down spreading modulates the frequency of the clock signal to only below the nominal frequency. A typical "triangle-shape modulated" down spreading can be illustrated by FIG. 2.

As shown in this figure, the triangle waveform of the modulation can be described by two linear equations below:

$$f = \begin{cases} (1-\delta)f_{nom} + 2f_m \cdot \delta \cdot f_{nom} \cdot t, \text{ if } 0 < t < \frac{1}{2f_m}; \\ (1-\delta)f_{nom} - 2f_m \cdot \delta \cdot f_{nom} \cdot t, \text{ if } \frac{1}{2f_m} < t < \frac{1}{f_m} \end{cases}$$

Wherein fnom is the nominal operating frequency when no SSC is applied, δ is the spectrum spreading ratio and fm is the modulation frequency.

For a phase-locked loop, modulation of frequency can be implemented by phase modulation, since the phase or delay error of the nominal frequency is the integration of the frequency error over time. The phase error of a triangle-wave down-spread spectrum clock can thus be derived as two piecewise quadratic polynomials by integrating above linear equations over time. For example, if the initial phase offset is 0, by decrfementing or incrementing the divider which yields a single-phase step (i.e., time leading in the case of down-spreading) at T=1/fnom, the resulting phase-versus-time diagram is given in FIG. 3. If the modulation frequency fm is chosen to be an integer division of the feedback clock (fbckl), i.e., input to phase/frequency detector), the time axis in FIG. 3 can be represented by "number of counts" determined by the counter 23 in FIG. 1. The phase-time relation ten becomes the predetermined step-versus-count map as depicted by the lower part of FIG. 3. As a result, it is possible to choose to decrement or resume the divider output phase by stepping at T.

Figure 3:
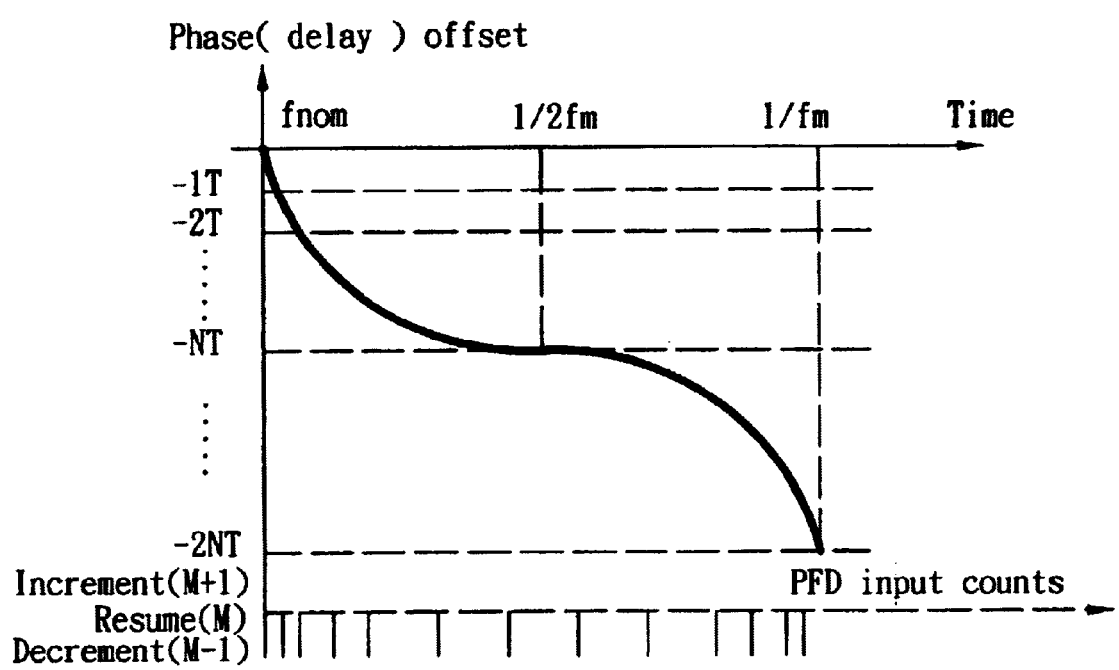
FIG. 3 shows the phase to time relation when down spreading the spectrum of clock signals.

The value of T can be determined according to the nature of the phase modulation curve at the upper part of FIG. 3. In this figure, when the slope of the phase-versus-time curve is sharper, width of the step shall be decremented. The multiplexer 22 is used to select output of divider 21 (divided by M+1, M or M−1), according to the status of the counter 23 (increment, resume or decrement).

Frequency signals generated by the multiplexer 22 are supplied, in addition to supplying to the counter 23, to the input node 15 of the phase-locked loop 10, as its feedback clock signals (fbclk). The feedback clock signal is added by the reference clock signal (refclk) and the result is used as the reference clock signal of the phase-locked loop 10.

The output clock signal (clkout) of the phase-locked loop 10 is modulated by the clock frequency divider 21 to generate a modulation waveform for the phase-locked loop 10, such that the clock signal of the phase-locked loop is spread to a predetermined width. The peak value of the clock signal is thus reduced. General speaking, spreading over 5% (5,000 ppm) of the targeted frequency, for example, may result in greater than 10 dB of peak energy reduction over non-SSC clock signals.

In the present invention, a phase-lock loop with fixed phase step modulation is provided. The divider of the divider 21 may be reduced to 2 to 3 steps. Manufacture cost may be saved, since number of components used in the present invention is reduce.

As the present invention has been shown and described with reference to preferred embodiments thereof, those skilled in the art will recognize that the above and other changes may be made therein without departing form the spirit and scope of the invention.

What is claimed is:

1. A phase-looked loop having spread spectrum clock, comprising a phase-locked loop and a spread spectrum clock generator;

wherein input signal to said phase-locked loop is from a reference clock source and output signal of said phase-locked loop is used as output standard clock signal of said phase-locked loop on the one hand and is supplied to said spread spectrum clock generator on the other hand;

said spread spectrum clock generator comprising:

a clock frequency divider to generate, based on output of said phase-locked loop at least two of a divided-by-M frequency, a divided-by-M+1 frequency and a divided-by-M−1 frequency; to a multiplexer to accept said at least two frequency signals of said clock frequency divider and to output one of said at least two frequency signals to said phase-locked loop; and a counter to accept said frequency signal of said multiplexer and to generate phase selection step according to count number of said counter to select said at least one frequency signal as output of said multiplexer.

2. The phase-lock loop having spread spectrum clock generator according to claim 1, wherein said counter generates said phase selection step when its count number reaches a predetermined value.

3. The phase-lock loop having spread spectrum clock generator according to claim 1 wherein said counter directs output frequency signal of said multiplexer to a look-up-table to determine the increment, decrement or resume of divider of said divider.

4. The phase-locked loop having spread spectrum clock generator according to claim 3, wherein said look-up-table comprises a phase to time reference table to include a plurality of time interval.

* * * * *